US007869259B2

(12) United States Patent
Asao

(10) Patent No.: US 7,869,259 B2
(45) Date of Patent: Jan. 11, 2011

(54) RESISTANCE CHANGE MEMORY, AND DATA WRITE AND ERASE METHODS THEREOF

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 12/406,898

(22) Filed: Mar. 18, 2009

(65) Prior Publication Data
US 2009/0296451 A1    Dec. 3, 2009

(30) Foreign Application Priority Data
May 27, 2008    (JP) .............................. 2008-138391

(51) Int. Cl.
*G11C 11/00* (2006.01)
(52) U.S. Cl. ................... 365/148; 365/158; 365/189.16
(58) Field of Classification Search ................ 365/148, 365/358, 171, 173, 189.16, 218; 257/536, 257/E29.166
See application file for complete search history.

(56) References Cited
U.S. PATENT DOCUMENTS
5,521,424 A * 5/1996 Ueno et al. ................. 257/632

7,755,932 B2 * 7/2010 Ito et al. ..................... 365/158
2004/0084714 A1 * 5/2004 Ishii et al. ................... 257/315

OTHER PUBLICATIONS

Gibson A., et al., "Stability of vacancy defects in MgO: The role of charge neutrality," Physical Review B vol. 50, No. 4, Jul. 15, 1994, pp. 2582-2592.

* cited by examiner

*Primary Examiner*—Gene N. Auduong
(74) *Attorney, Agent, or Firm*—Knobbe, Martens, Olson & Bear LLP

(57) ABSTRACT

A resistance change memory includes a first interconnection, a second interconnection, a first resistance change element which has a first electrode, a second electrode, and a first tunnel insulating film provided between the first electrode and the second electrode, the first tunnel insulating film including a first trap region formed by introducing defects to trap holes or electrons, and the second electrode being connected to the first interconnection, and a first transistor whose current path has one end connected to the first electrode and the other end connected to the second interconnection.

20 Claims, 8 Drawing Sheets

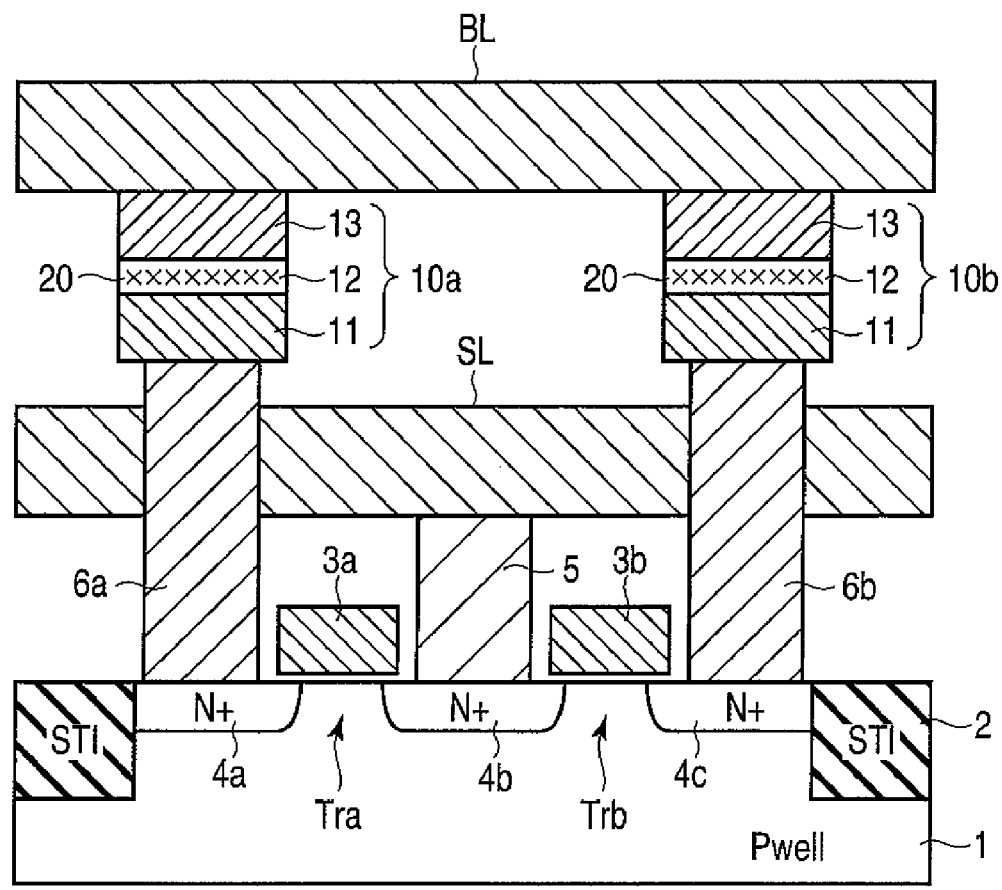
F I G. 1

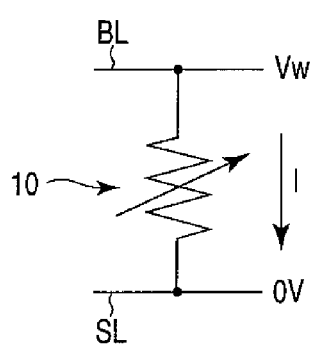
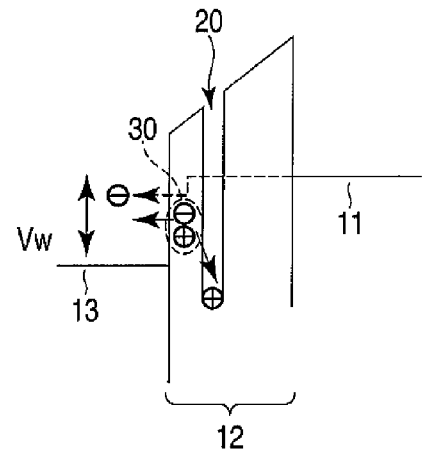
F I G. 3A  F I G. 3B
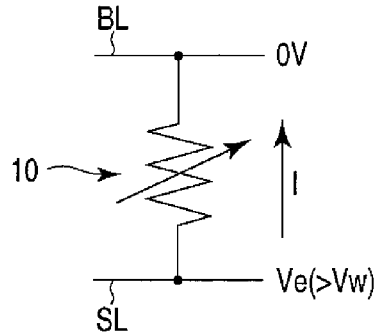
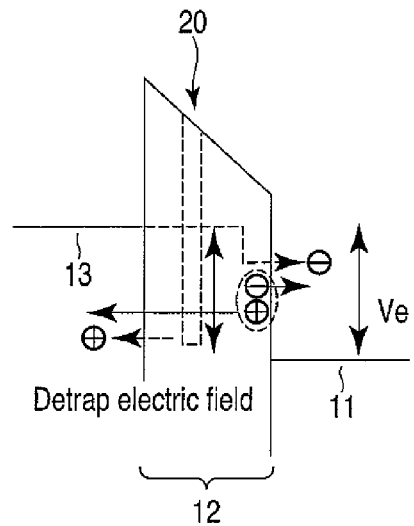
F I G. 4A  F I G. 4B

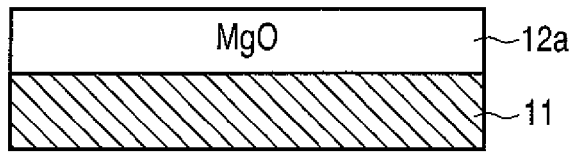
F I G. 6A
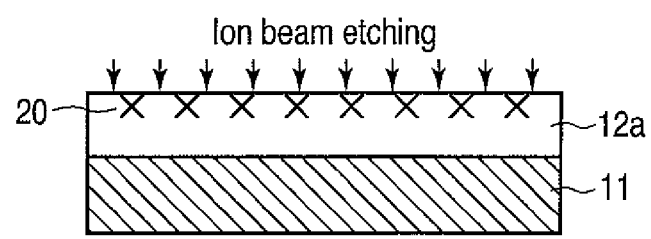
F I G. 6B
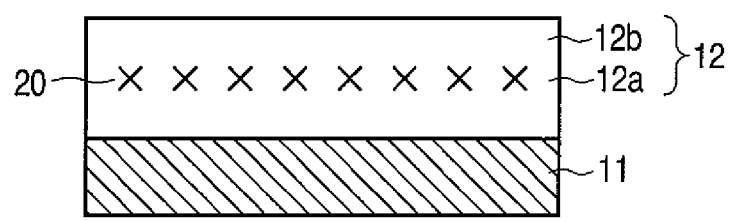
F I G. 6C
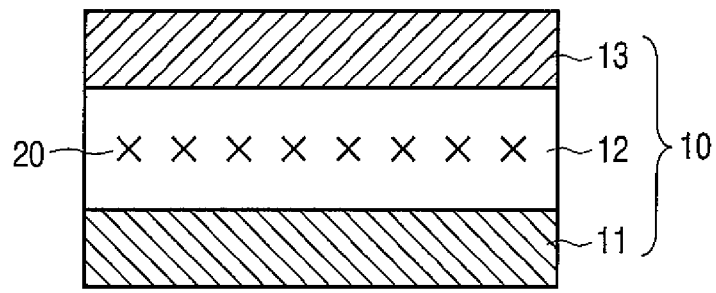
F I G. 6D Electron trap type (high-resistance write)

Electron trap type (high-resistance write)

Electron trap type (erase)

Electron trap type (erase)

RESISTANCE CHANGE MEMORY, AND DATA WRITE AND ERASE METHODS THEREOF

CROSS-REFERENCE TO RELATED APPLICATIONS

This application is based upon and claims the benefit of priority from prior Japanese Patent Application No. 2008-138391, filed May 27, 2008, the entire contents of which are incorporated herein by reference.

BACKGROUND OF THE INVENTION

1. Field of the Invention The present invention relates to a resistance change memory having a resistance change element functioning as a memory element, and data write and erase methods thereof.

2. Description of the Related Art

A lot of memories which store information based on a new principle have been proposed recently. One of them is a resistance change memory. The resistance change memory normally includes a memory element which stores data, and a MOSFET which selects the memory element. The memory element which stores data uses, e.g., an MTJ (Magnetic Tunnel Junction), chalcogenide glass, or a strongly correlated electron system material. In general, a memory using an MTJ is called an MRAM (Magnetoresistive Random Access Memory), a memory using chalcogenide glass is called a PRAM (Phase-change Random Access Memory), and a memory using a strongly correlated electron system material is called an ReRAM (Resistance Random Access Memory).

An example of related art reference information associated with the present invention is as follows.

[Non-Patent Reference 1] A. Gibson, R. Haydock, and J. LaFemina, "Stability of vacancy defects in MgO: The role of charge neutrality", Physical Review B volume 50, Number 4, 1994.

BRIEF SUMMARY OF THE INVENTION

A resistance change memory according to a first aspect of the present invention comprising a first interconnection; a second interconnection; a first resistance change element which has a first electrode, a second electrode, and a first tunnel insulating film provided between the first electrode and the second electrode, the first tunnel insulating film including a first trap region formed by introducing defects to trap holes or electrons, and the second electrode being connected to the first interconnection; and a first transistor whose current path has one end connected to the first electrode and the other end connected to the second interconnection.

A data write method of a resistance change memory according to a second aspect of the present invention, the resistance change memory including a first interconnection; a second interconnection; a resistance change element which has a first electrode, a second electrode, and a tunnel insulating film provided between the first electrode and the second electrode, the tunnel insulating film including first trap region formed by introducing defects to trap holes or electrons, and the second electrode being connected to the first interconnection; and a transistor whose current path has one end connected to the first electrode and the other end connected to the second interconnection, and the method comprising writing data by applying a voltage between the first interconnection and the second interconnection and causing the first trap region to trap the holes or the electrons generated upon impact ionization.

A data erase method of a resistance change memory according to a third aspect of the present invention, the resistance change memory including a first interconnection; a second interconnection; a resistance change element which has a first electrode, a second electrode, and a tunnel insulating film provided between the first electrode and the second electrode, the tunnel insulating film including a trap region formed by introducing defects to trap holes or electrons, and the second electrode being connected to the first interconnection; and a transistor whose current path has one end connected to the first electrode and the other end connected to the second interconnection, and the method comprising erasing data by applying a voltage between the first interconnection and the second interconnection to detrap the holes or the electrons trapped by the trap region.

BRIEF DESCRIPTION OF THE SEVERAL VIEWS OF THE DRAWING

FIG. 1 is a schematic sectional view of the cell structure of a resistance change memory according to an embodiment of the present invention;

FIGS. 3A and 3B are views for explaining a low resistance write operation of a hole trap type according to an embodiment of the present invention;

FIGS. 4A and 4B are views for explaining an erase operation of a hole trap type according to an embodiment of the present invention;

FIGS. 6A to 6D are sectional views showing steps in the manufacture of a resistance change element of a hole trap type using an ion beam etching method according to an embodiment of the present invention;

DETAILED DESCRIPTION OF THE INVENTION

Figure 2A:
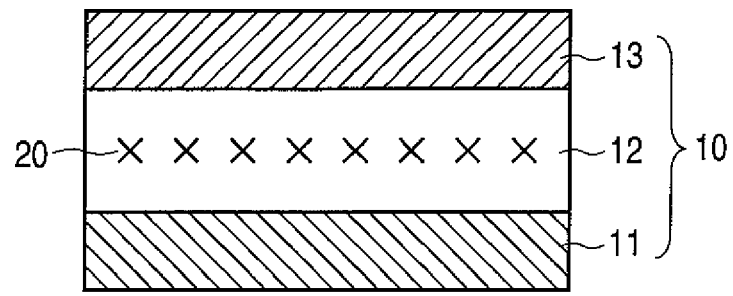
FIGS. 2A to 2D are sectional views showing trap regions in a tunnel insulating film according to an embodiment of the present invention.

An embodiment of the present invention will now be described with reference to the accompanying drawing. In the following explanation, the same reference numerals denote the same parts throughout the drawing.

[1] Arrangement

A schematic memory cell arrangement of a resistance change memory according to an embodiment of the present invention will be described with reference to FIG. 1.

As shown in FIG. 1, one cell of the resistance change memory includes a resistance change element 10a functioning as a memory element, and a transistor (e.g., MOSFET) Tra connected in series with the resistance change element 10a. The resistance change element 10a is a MIM (Metal Insulator Metal) element, and includes a lower electrode 11 and an upper electrode 13 which are made of a metal, and a tunnel insulating film 12 sandwiched between the lower electrode 11 and the upper electrode 13. The tunnel insulating film 12 has trap regions 20 where defects to trap holes or electrons are introduced. Details of the trap region 20 will be described later.

The upper electrode 13 is connected to a bit line BL. The lower electrode 11 is connected to one end (source/drain diffusion layer 4a) of the current path of the transistor Tra via a contact 6a. The other end (source/drain diffusion layer 4b) of the current path of the transistor Tra is connected to a source line SL via a contact 5.

The bit line BL and the source line SL are shared by adjacent memory cells. More specifically, the upper electrode 13 of a resistance change element 10b is connected to the bit line BL. The lower electrode 11 is connected to one end (source/drain diffusion layer 4c) of the current path of a transistor Trb via a contact 6b. The other end (source/drain diffusion layer 4b) of the current path of the transistor Trb is connected to the source line SL via the contact 5.

The transistors Tra and Trb are formed on a semiconductor substrate 1. On the semiconductor substrate 1, gate electrodes 3a and 3b which form the transistors Tra and Trb are formed on both sides of the contact 5. The gate electrodes 3a and 3b run in a direction perpendicular to the bit line BL and the source line SL, which run in the same direction.

The resistance change elements 10a and 10b are generally referred to as a resistance change element 10 hereinafter.

[2] Trap Region

The trap region of the tunnel insulating film according to an embodiment of the present invention will be described with reference to FIGS. 2A to 2D.

In this embodiment, the trap regions 20 are formed in the tunnel insulating film 12 sandwiched between the electrodes 11 and 13 made of a metal, as described above. The trap regions 20 are regions in which some of elements contained in the tunnel insulating film 12 are defective. For example, if the tunnel insulating film 12 is made of magnesium oxide (MgO), a region where magnesium (Mg) or oxygen (O) is defective serves as the trap region 20.

Figure 2B:
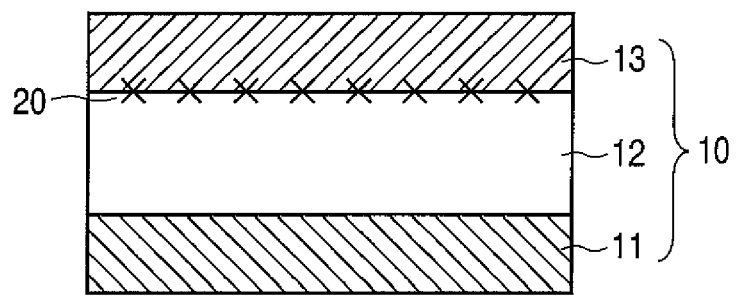
Figure 2C:
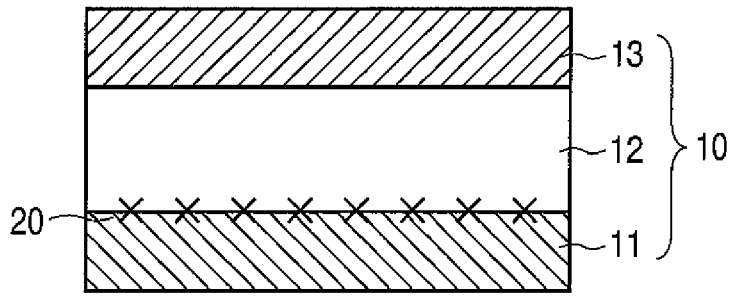
Figure 2D:
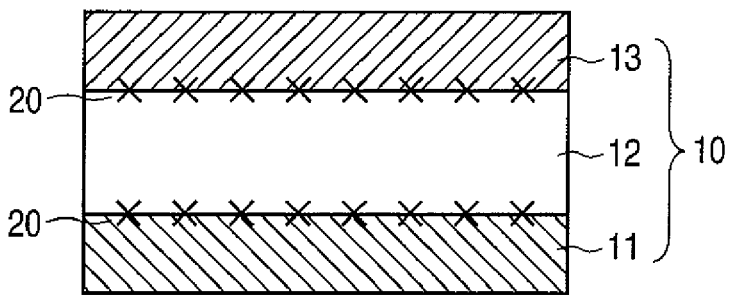

The trap regions 20 can be formed as any position in the tunnel insulating film 12. For example, the trap regions 20 can be formed in the middle of the tunnel insulating film 12 in the thickness direction while existing all over the film surface, as shown in FIG. 2A. The trap regions 20 may be formed in the interface between the tunnel insulating film 12 and the upper electrode 13 while existing all over the film surface, as shown in FIG. 2B. Alternatively, the trap regions 20 may be formed in the interface between the tunnel insulating film 12 and the lower electrode 11 while existing all over the film surface, as shown in FIG. 2C. Otherwise, the trap regions 20 may be formed both in the interface between the tunnel insulating film 12 and the upper electrode 13 and in the interface between the tunnel insulating film 12 and the lower electrode 11 while existing all over the film surface, as shown in FIG. 2D. Note that the trap region 20 need not always be formed all over the surface of the tunnel insulating film 12 and may be formed partially.

In a write operation, the trap regions 20 trap electrons or holes generated upon impact ionization, and change the conductivity of the tunnel insulating film 12, thereby creating the low resistance state or high resistance state of the resistance change element 10. Hence, in this embodiment, the conductivity of the tunnel insulating film 12 is varied by injecting electrons or holes so that the memory operates as a resistance change memory.

In the following description, an arrangement in which the trap regions 20 trap holes will be referred to as a "hole trap type", and an arrangement in which the trap regions 20 trap electrons will be referred to as an "electron trap type". The hole trap type and the electron trap type will be described below in detail using the tunnel insulating film 12 made of MgO as an example.

[3] Hole Trap Type

A hole trap type forms the trap regions 20 of Mg defects and causes them to trap holes. This type raises the conductivity of the tunnel insulating film 12 and creates the low resistance state of the resistance change element 10.

[3-1] Low Resistance Write

The write operation of the hole trap type according to the embodiment will be described with reference to FIGS. 3A and 3B. In an example to be described below, the trap regions 20 are formed in the interface between the tunnel insulating film 12 and the upper electrode 13.

In the write operation, first, a positive voltage Vw is applied to the side of the upper electrode 13 (bit line BL) to introduce electrons from the side of the lower electrode 11 (source line SL). The electrons change to impact ions in the interface between the tunnel insulating film 12 and the upper electrode 13 to generate electron-hole pairs 30. The electrons are drifted to the upper electrode 13 by the electric field. On the other hand, the holes are trapped by the hole trap regions 20 to push down the conduction band. As a result, the electron current increases, and the conductivity of the tunnel insulating film 12 increases. The holes trapped by the hole trap region 20 have a deep level and nonvolatility. The above-described operation makes it possible to write-access the resistance change element 10 to the low resistance state.

For example, a case in which the resistance change element 10 is write-accessed to the low resistance state using such a resistance change is defined as "1". A case in which the resistance change element 10 is not write-accessed to the low resistance state is defined as "0". This enables binary write.

[3-2] Erase

The erase operation of the hole trap type according to the embodiment will be described with reference to FIGS. 4A and 4B. In an example to be described below, the trap regions 20 are formed in the interface between the tunnel insulating film 12 and the upper electrode 13.

In the erase operation, first, a positive voltage Ve is applied to the side of the lower electrode 11 (source line SL). Due to the Coulomb force between the upper electrode 13 and the holes trapped by the trap regions 20, the holes are detrapped by the upper electrode 13. As a result, the resistance rises to decrease the conductivity of the tunnel insulating film 12. This allows data erase.

[3-3] Readout

The readout operation of the hole trap type according to the embodiment will be described. First, a readout current or voltage is applied to the resistance change element 10 of a selected cell. The readout value is sensed, and "1" or "0" is determined based on the change of the readout value with respect to a reference value.

For example, a case in which the resistance change element 10 is write-accessed to the low resistance state is defined as "1". A case in which the resistance change element 10 is not write-accessed to the low resistance state is defined as "0".

Determination is done based on the readout voltage. If the readout voltage value is smaller than the reference voltage value, the data is determined as "1". If the readout voltage value is the same as the reference voltage value, the data is determined as "0".

[3-4] Manufacturing Method

A method of manufacturing a resistance change element of a hole trap type using a plasma oxidation method according to this embodiment will be described with reference to FIGS. 5A to 5D.

Figure 5A:
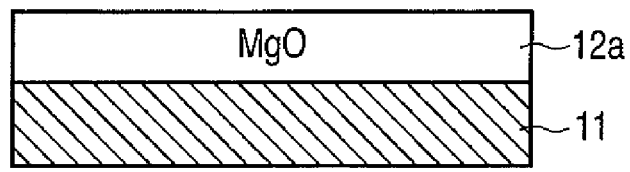
FIGS. 5A to 5D are sectional views showing steps in the manufacture of a resistance change element of a hole trap type using a plasma oxidation method according to an embodiment of the present invention.
Figure 5B:
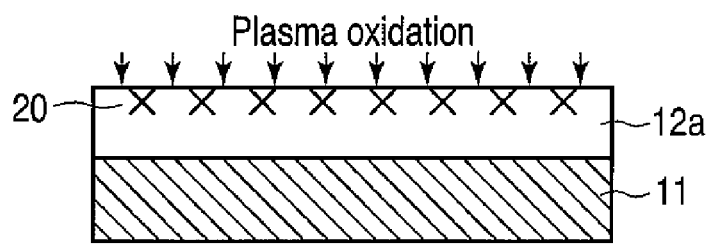
Figure 5C:
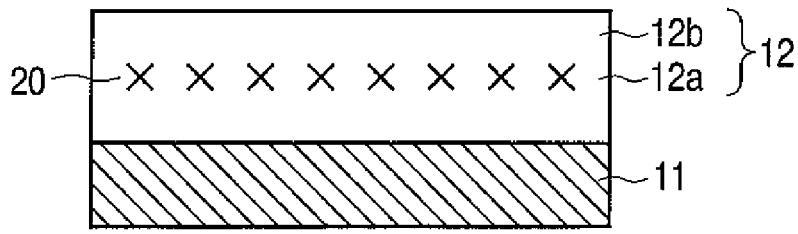
Figure 5D:
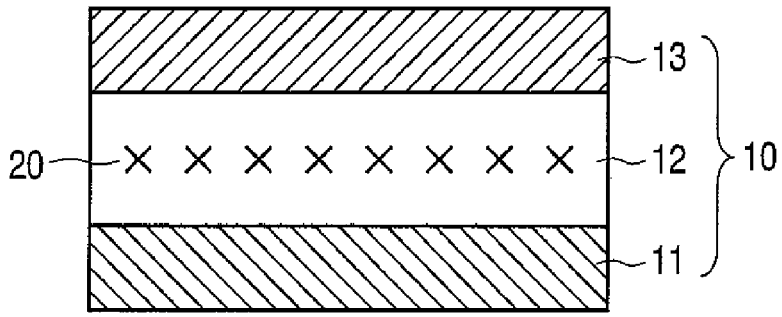

As shown in FIG. 5A, the lower electrode 11 made of, e.g., 50-nm thick Ta is formed. For example, a 0.5-nm thick MgO film 12a is formed on the lower electrode 11 by sputtering. Next, as shown in FIG. 5B, the surface of the MgO film 12a is oxidized by plasma oxidation. At this time, Mg defects are formed in the surface of the MgO film 12a so that the hole trap regions 20 are generated. As shown in FIG. 5C, for example, a 0.5-nm thick MgO film 12b is formed by sputtering, thereby forming the tunnel insulating film 12 having a total thickness of about 1 nm. Then, as shown in FIG. 5D, the upper electrode 13 made of, e.g., 50-nm thick Ta is formed on the tunnel insulating film 12.

A method of manufacturing a resistance change element of a hole trap type using an ion beam etching method according to this embodiment will be described with reference to FIGS. 6A to 6D.

As shown in FIG. 6A, the lower electrode 11 made of, e.g., 50-nm thick Ta is formed. For example, the 0.5-nm thick MgO film 12a is formed on the lower electrode 11 by sputtering. Next, as shown in FIG. 6B, the surface of the MgO film 12a is sputtered by, e.g., Ar ions by ion beam etching. At this time, Mg defects are formed in the surface of the MgO film 12a so that the hole trap regions 20 are generated. As shown in FIG. 6C, for example, the 0.5-nm thick MgO film 12b is formed by sputtering, thereby forming the tunnel insulating film 12 having a total thickness of about 1 nm. Then, as shown in FIG. 6D, the upper electrode 13 made of, e.g., 50-nm thick Ta is formed on the tunnel insulating film 12.

A method of manufacturing a resistance change element of a hole trap type using an impurity doping method according to this embodiment will be described with reference to FIGS. 7A to 7D.

Figure 7A:
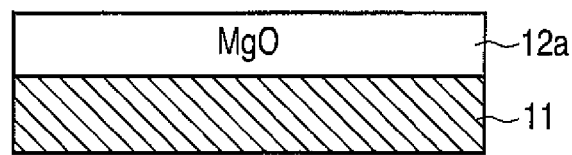
FIGS. 7A to 7D are sectional views showing steps in the manufacture of a resistance change element of a hole trap type using an impurity doping method according to an embodiment of the present invention.
Figure 7B:
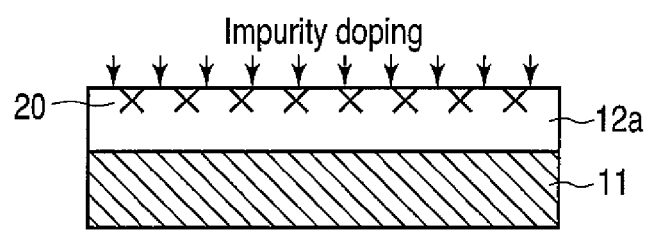
Figure 7C:
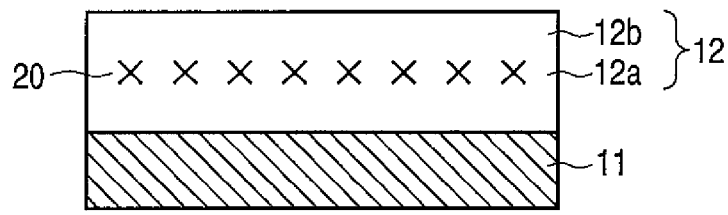
Figure 7D:
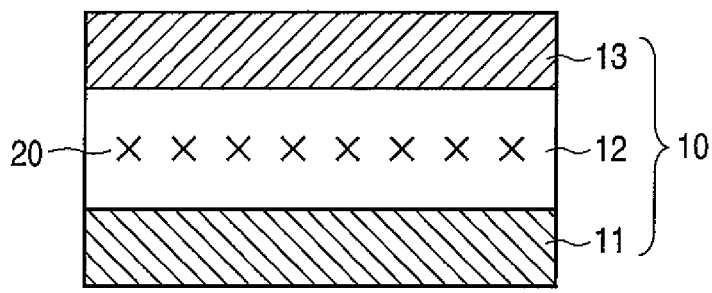

As shown in FIG. 7A, the lower electrode 11 made of, e.g., 50-nm thick Ta is formed. For example, the 0.5-nm thick MgO film 12a is formed on the lower electrode 11 by sputtering. Next, as shown in FIG. 7B, the surface of the MgO film 12a is doped with an impurity (e.g., Cr) by, e.g., ion implantation or sputtering. At this time, Mg defects are formed in the surface of the MgO film 12a so that the hole trap regions 20 are generated. As shown in FIG. 7C, for example, the 0.5-nm thick MgO film 12b is formed by sputtering, thereby forming the tunnel insulating film 12 having a total thickness of about 1 nm. Then, as shown in FIG. 7D, the upper electrode 13 made of e.g., 50-nm thick Ta is formed on the tunnel insulating film 12.

In the above-described processes, it is possible to control the position in the tunnel insulating film 12 where defects are to be introduced by plasma oxidation, ion beam etching, or impurity doping and control the formation position of the hole trap regions 20 in the tunnel insulating film 12. This enables to control the erase energy characteristic and data holding characteristic of the hole trap.

[4] Electron Trap Type

An electron trap type forms the trap regions 20 of oxygen defects and causes them to trap electrons. This type lowers the conductivity of the tunnel insulating film 12 and creates the high resistance state of the resistance change element 10.

[4-1] High Resistance Write

Figure 8A:
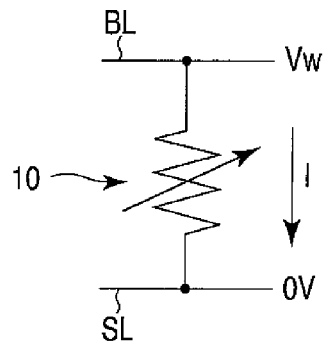
FIGS. 8A and 8B are views for explaining a high resistance write operation of an electron trap type according to an embodiment of the present invention.
Figure 8B:
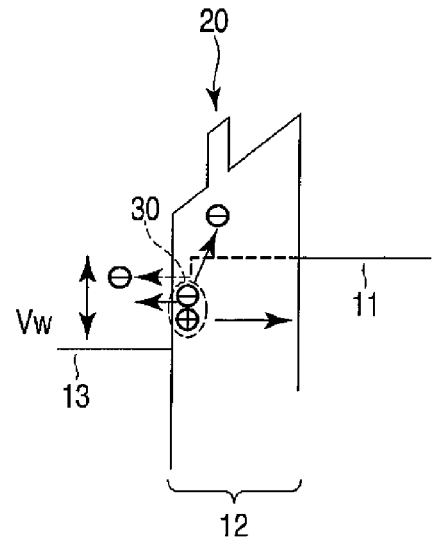

The write operation of the electron trap type according to the embodiment will be described with reference to FIGS. 8A and 8B. In an example to be described below, the trap regions 20 are formed in the interface between the tunnel insulating film 12 and the upper electrode 13.

In the write operation, first, the positive voltage Vw is applied to the side of the upper electrode 13 (bit line BL) to introduce electrons from the side of the lower electrode 11 (source line SL). The electrons change to impact ions in the interface between the tunnel insulating film 12 and the upper electrode 13 to generate the electron-hole pairs 30. The holes are drifted to the lower electrode 11 by the electric field. On the other hand, the electrons are trapped by the electron trap regions 20 to push up the conduction band. As a result, the electron current decreases, and the conductivity of the tunnel insulating film 12 decreases. The electrons trapped by the electron trap region 20 have a high level and nonvolatility. The above-described operation makes it possible to write-access the resistance change element 10 to the high resistance state.

For example, a case in which the resistance change element 10 is write-accessed to the high resistance state using such a resistance change is defined as "1". A case in which the resistance change element 10 is not write-accessed to the high resistance state is defined as "0". This enables binary write.

[4-2] Erase

Figure 9A:
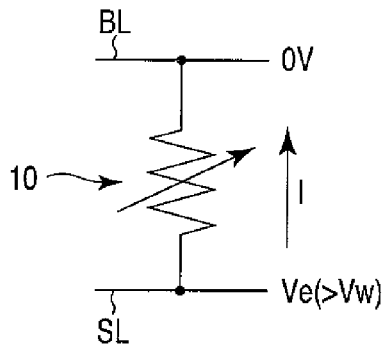
FIGS. 9A and 9B are views for explaining an erase operation of an electron trap type according to an embodiment of the present invention.
Figure 9B:
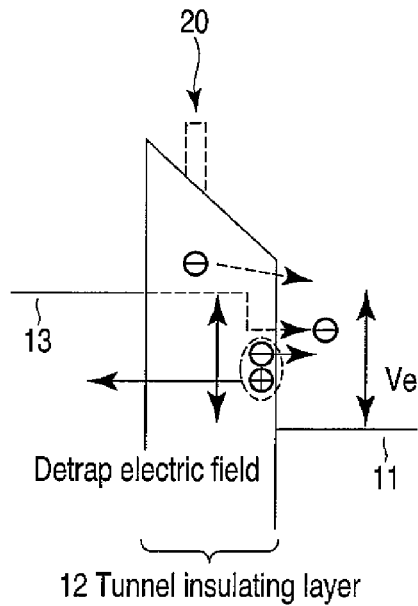

The erase operation of the electron trap type according to the embodiment will be described with reference to FIGS. 9A and 9B. In an example to be described below, the trap regions 20 are formed in the interface between the tunnel insulating film 12 and the upper electrode 13.

In the erase operation, first, the positive voltage Ve is applied to the side of the lower electrode 11 (source line SL). Due to the Coulomb force between the lower electrode 11 and the electrons trapped by the trap regions 20, the electrons are detrapped by the lower electrode 11. As a result, the resistance drops to increase the conductivity of the tunnel insulating film 12. This allows data erase.

[4-3] Readout

The readout operation of the electron trap type according to the embodiment will be described. First, a readout current or voltage is applied to the resistance change element 10 of a selected cell. The readout value is sensed, and "1" or "0" is determined based on the change of the readout value with respect to a reference value.

For example, a case in which the resistance change element 10 is write-accessed to the high resistance state is defined as "1". A case in which the resistance change element 10 is not write-accessed to the high resistance state is defined as "0", Determination is done based on the readout voltage. If the readout voltage value is larger than the reference voltage value, the data is determined as "1". If the readout voltage value is the same as the reference voltage value, the data is determined as "0".

[4-4] Manufacturing Method

A method of manufacturing a resistance change element of an electron trap type using an annealing method according to this embodiment will be described with reference to FIGS. 10A to 10D.

Figure 10A:
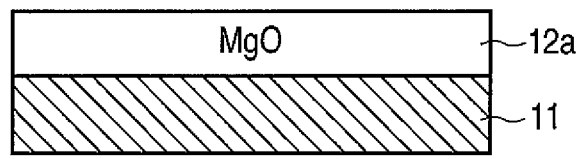
FIGS. 10A to 10D are sectional views showing steps in the manufacture of a resistance change element of an electron trap type using an annealing method according to an embodiment of the present invention.
Figure 10B:
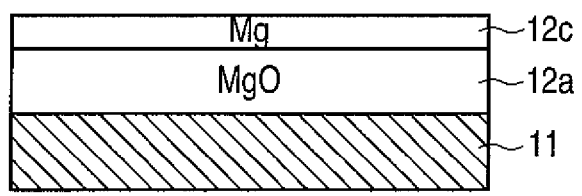
Figure 10C:
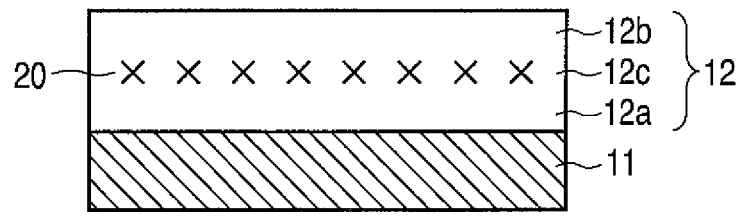
Figure 10D:
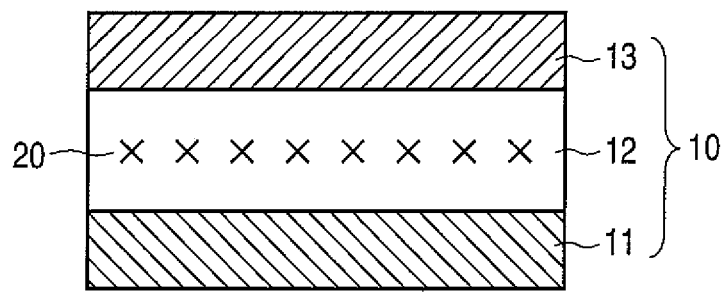

As shown in FIG. 10A, the lower electrode 11 made of, e.g., 50-nm thick Ta is formed. For example, the 0.5-nm thick MgO film 12a is formed on the lower electrode 11 by sputtering. Next, as shown in FIG. 10B, an MgO film 12c is formed on the MgO film 12a by sputtering. As shown in FIG. 10C, for example, the 0.5-nm thick MgO film 12b is formed on the MgO film 12c by sputtering and annealed, thereby forming the tunnel insulating film 12 having a total thickness of about 1 nm. At this time, oxygen defects are formed in the tunnel insulating film 12 so that the electron trap regions 20 are generated. Then, as shown in FIG. 10D, the upper electrode 13 made of, e.g., 50-nm thick Ta is formed on the tunnel insulating film 12.

In the above-described process, it is possible to control the position in the tunnel insulating film 12 where defects are to be introduced by annealing and control the formation position of the electron trap regions 20 in the tunnel insulating film 12. This enables to control the erase energy characteristic and data holding characteristic of the electron trap.

The above-described impurity doping method for the hole trap type is also usable for the electron trap type. In this case, oxygen defects are formed in the tunnel insulating film 12 by impurity doping, thereby forming the electron trap regions 20. The impurity to be used for doping is preferably, e.g., Ni or Fe.

[5] Multilevel

A binary memory has been explained in the above embodiment. It is also possible to implement a multilevel memory.

For example, the hole or electron trap regions 20 are formed by current application. The longer the current application time is, the higher the trap density is. The barrier height change amount increases, and the resistance change ratio also rises. A multilevel memory such as a ternary or more memory can be implemented using the fact.

A ternary memory can be implemented by forming both the hole trap regions 20 and the electron trap regions 20 in the tunnel insulating film 12. More specifically, the first trap regions 20 formed in the interface between the tunnel insulating film 12 and the upper electrode 13 or the second trap regions 20 formed in the interface between the tunnel insulating film 12 and the lower electrode 11 are formed as electron trap regions. The other of the first trap regions 20 and the second trap regions 20 are formed as hole trap regions.

[6] Effects

According to an embodiment of the present invention, a transistor Tr and the resistance change element 10 formed from the tunnel insulating film 12 sandwiched between the two metal electrodes 11 and 13 are connected in series between the bit line BL and the source line SL. The trap regions 20 are formed by introducing defects to trap holes or electrons into the tunnel insulating film 12. This makes it possible to change the conductivity of the tunnel barrier and implement the operation of the resistance change memory.

[7] MRAM

The resistance change memory according to an embodiment of the present invention is applicable to an MRAM using an MTJ, a PRAM using chalcogenide glass, and ReRAM using a strongly correlated electron system material.

When the resistance change memory is applied to an MRAM, the resistance change elements 10a and 10b in the structure shown in FIG. 1 are MTJ elements. More specifically, the lower electrode 11 and the upper electrode 13 are ferroelectric layers. One of the lower electrode 11 and the upper electrode 13 serves as a fixed layer, and the other serves as a recording layer.

In the structure shown in FIG. 1, one of the fixed layer and the recording layer may be formed between the lower electrode 11 and the tunnel insulating film 12, and the other of the fixed layer and the recording layer may be formed between the upper electrode 13 and the tunnel insulating film 12.

When the resistance change memory according to an embodiment of the present invention is applied to an MRAM, the resistance change according to TMR effect is added to the resistance change according to the electron trap or the hole trap. Accordingly, it is also possible to implement a multilevel memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
   a first line;
   a second line substantially parallel to the first line;
   a first resistance change element which comprises a first electrode, a second electrode, and a first tunnel insulating film between the first electrode and the second electrode, the first tunnel insulating film comprising a first trap region comprising defects configured to trap either holes or electrons, and the second electrode being connected to the first line; and
   a first transistor comprising a current path comprising a first end connected to the first electrode and a second end connected to the second line.

2. The memory of claim 1, wherein the first trap region is located in at least one of a first interface between the first electrode and the first tunnel insulating film and a second interface between the second electrode and the first tunnel insulating film.

3. The memory of claim 2, wherein the first trap region is on a film surface of the first tunnel insulating film.

4. The memory of claim 1, wherein the first tunnel insulating film comprises magnesium oxide, and the first trap region comprises magnesium defects, and
   the first trap region is configured to trap the holes in a data write mode.

5. The memory of claim 4, wherein the first trap region is formed by either oxidizing, ion beam etching, or impurity doping during formation of a magnesium oxide film.

6. The memory of claim 1, wherein the first tunnel insulating film comprises magnesium oxide, and the first trap region comprises oxygen defects, and
   the first trap region is configured to trap the electrons in a data write mode.

7. The memory of claim 6, wherein the first trap region is formed by introducing either annealing or impurity doping during formation of a magnesium oxide film.

8. The memory of claim 1, further comprising:
   a second resistance change element which comprises a third electrode, a fourth electrode, and a second tunnel insulating film between the third electrode and the fourth electrode, the second tunnel insulating film comprising a second trap region comprising defects configured to trap either holes or electrons, and the fourth electrode being connected to the first line; and
   a second transistor comprising a current path comprising a first end connected to the third electrode and a second end connected to the second interconnection.

9. The memory of claim 1, wherein
   the second trap region is in the first tunnel insulating film, the first trap region comprises defects configured to trap the holes, and the second trap region comprises defects configured to trap the electrons.

10. A method of writing data in a resistance change memory, the method comprising:

providing the resistance change memory which comprises:
a first line;
a second line substantially parallel to the first line;
a resistance change element which comprises a first electrode, a second electrode, and a tunnel insulating film between the first electrode and the second electrode, the tunnel insulating film comprising a first trap region comprising defects configured to trap either holes or electrons, and the second electrode being connected to the first line; and
a transistor comprising a current path comprising a first end connected to the first electrode and a second end connected to the second line, and writing data by applying a voltage between the first line and the second line and causing the first trap region to trap the holes or the electrons generated upon impact ionization.

11. The method of claim 10, wherein the tunnel insulating film comprises a magnesium oxide, and the first trap region comprises magnesium defects, and the first trap region is configured to trap the holes in order to increase a conductivity of the tunnel insulating film, and to change a resistance value of the resistance change element in a data write mode.

12. The method of claim 11, wherein the first trap region is formed by either oxidizing, ion beam etching, or impurity doping during formation of a magnesium oxide film.

13. The method of claim 10, wherein the tunnel insulating film comprises magnesium oxide, and the first trap region comprises oxygen defects, and the first trap region is configured to trap the electrons in order to decrease a conductivity of the tunnel insulating film, and to change a resistance value of the resistance change element in a data write mode.

14. The method of claim 13, wherein the first trap region is formed by either annealing or impurity doping during formation of a magnesium oxide film.

15. The method of claim 10, wherein the first trap region is in at least one of a first interface between the first electrode and the tunnel insulating film and a second interface between the second electrode and the tunnel insulating film.

16. The method of claim 10, wherein
a second trap region is in the tunnel insulating film, and
the first trap region is configured to trap the holes, and the second trap region is configured to trap the electrons, storing ternary data in the resistance change element in a data write mode.

17. A method of erasing data in a resistance change memory, the method comprising:

providing the resistance change memory which comprises:
a first line;
a second line substantially parallel to the first line;
a resistance change element comprising a first electrode, a second electrode, and a tunnel insulating film between the first electrode and the second electrode, the tunnel insulating film comprising a trap region comprising defects configured to trap either holes or electrons, and the second electrode being connected to the first line; and
a transistor comprising a current path comprising a first end connected to the first electrode and a second end connected to the second line, and erasing data by applying a voltage between the first line and the second line in order to release either the holes or the electrons trapped by the trap region.

18. The method of claim 17, wherein the tunnel insulating film comprises magnesium oxide, and the trap region comprises magnesium defects, and the method further comprising:

releasing the holes trapped by the trap region in a data erase mode.

19. The method of claim 17, wherein the tunnel insulating film comprises magnesium oxide, and the trap region comprises oxygen defects, and the method further comprising:

releasing the electrons trapped by the trap region in a data erase mode.

20. The method of claim 17, wherein the trap region is in at least one of a first interface between the first electrode and the tunnel insulating film and a second interface between the second electrode and the tunnel insulating film.

* * * * *